(12) United States Patent
Liu et al.

(10) Patent No.: US 9,941,109 B2
(45) Date of Patent: Apr. 10, 2018

(54) SURFACE TREATMENT IN A CHEMICAL MECHANICAL PROCESS

(71) Applicant: Taiwan Semiconductor Manufacturing Company, Ltd., Hsin-Chu (TW)

(72) Inventors: Chih-Wen Liu, Taoyuan (TW); Che-Hao Tu, Hsin-Chu (TW); Po-Chin Nien, Taipei (TW); William Weilun Hong, Hsin-Chu (TW); Ying-Tsung Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/197,439

(22) Filed: Jun. 29, 2016

(65) Prior Publication Data
US 2018/0005840 A1    Jan. 4, 2018

(51) Int. Cl.
*H01L 21/02* (2006.01)
*H01L 21/306* (2006.01)
*H01L 21/67* (2006.01)
*H01L 21/683* (2006.01)
*B24B 37/04* (2012.01)
*H01L 21/321* (2006.01)
*B24B 1/00* (2006.01)

(52) U.S. Cl.
CPC .......... *H01L 21/02052* (2013.01); *B24B 1/00* (2013.01); *B24B 37/044* (2013.01); *H01L 21/30625* (2013.01); *H01L 21/3212* (2013.01); *H01L 21/67046* (2013.01); *H01L 21/67051* (2013.01); *H01L 21/67092* (2013.01); *H01L 21/6838* (2013.01)

(58) Field of Classification Search
None
See application file for complete search history.

(56) References Cited

U.S. PATENT DOCUMENTS

| | | | | |
|---|---|---|---|---|
| 6,988,936 B2* | 1/2006 | Filipozzi | ............. | B24B 37/0056 451/41 |
| 2007/0006894 A1* | 1/2007 | Zhang | ...................... | C11D 1/08 134/2 |

* cited by examiner

*Primary Examiner* — Jiong-Ping Lu
(74) *Attorney, Agent, or Firm* — Slater Matsil, LLP

(57) ABSTRACT

A method is presented that includes the step of polishing a wafer positioned on a platen. After polishing the wafer, the method includes initiating a high pressure rinse on the wafer while the wafer is positioned on the platen, wherein the high pressure rinse includes a hydrophilic solution. The wafer is soaked in the hydrophilic solution, and after soaking the wafer, the wafer is cleaned.

20 Claims, 6 Drawing Sheets

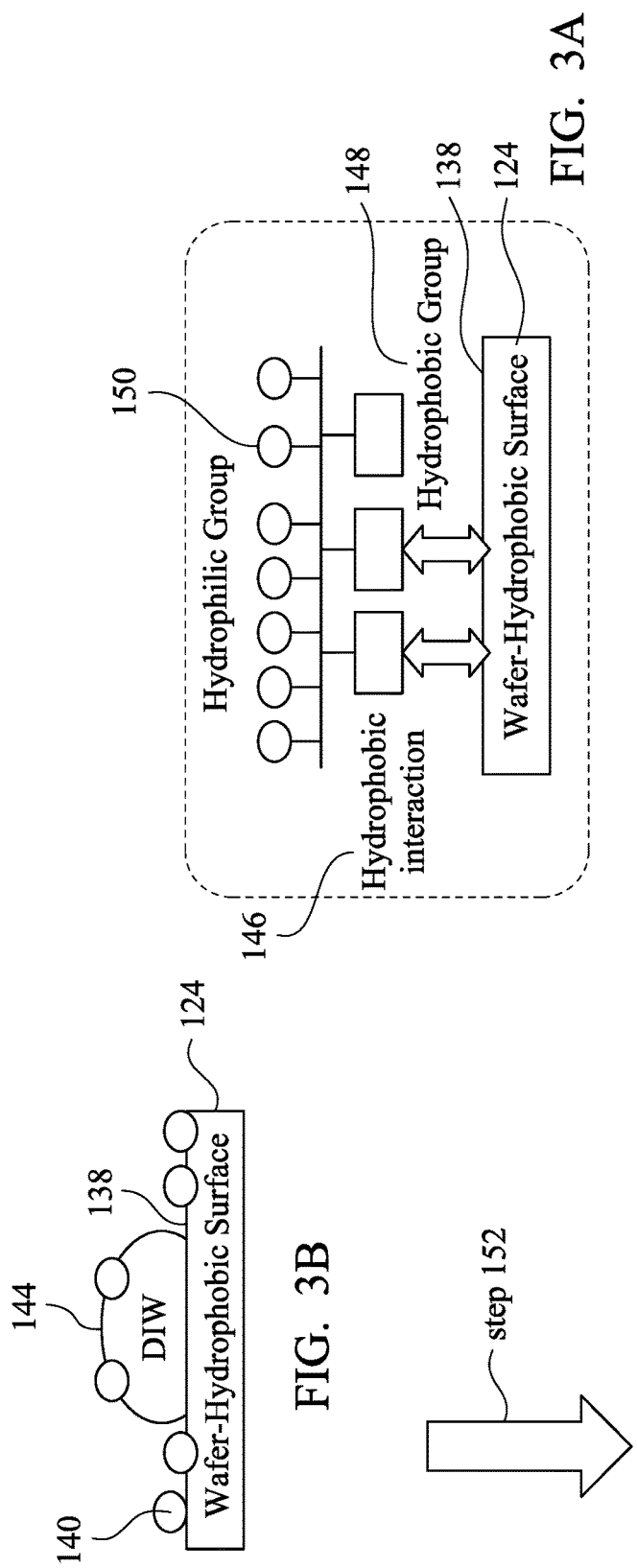
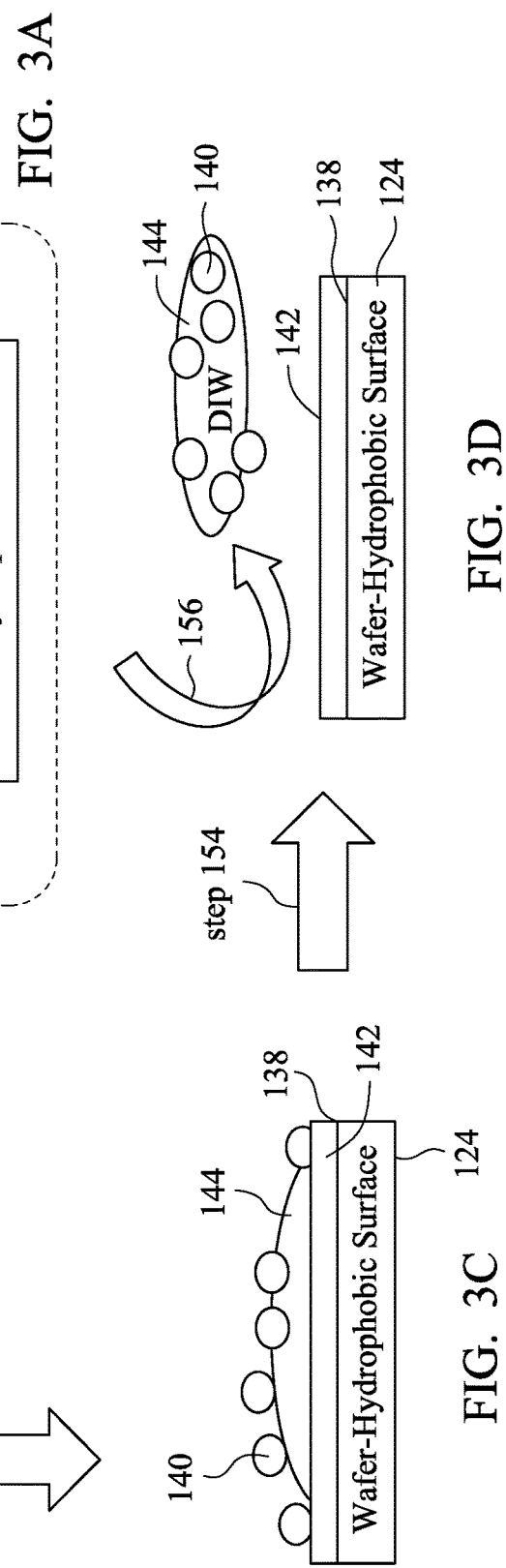
FIG. 3A
FIG. 3B
FIG. 3C
FIG. 3D

SURFACE TREATMENT IN A CHEMICAL MECHANICAL PROCESS

BACKGROUND

Chemical Mechanical Polish (CMP) processes are widely used in the fabrication of integrated circuits. When an integrated circuit is built up layer by layer on the surface of a semiconductor wafer, CMP processes are used to planarize the topmost layer to provide a planar surface for subsequent fabrication steps. CMP processes are carried out by polishing the wafer surface against a polish pad. A slurry, that in some aspects contains both abrasive particles and reactive chemicals, is applied to the polish pad. The relative movement of the polish pad and wafer surface coupled with the reactive chemicals in the slurry allows the CMP process to planarize the wafer surface by means of both physical and chemical forces.

CMP processes can be used for the fabrication of various components of an integrated circuit. For example, CMP processes may be used to planarize inter-level dielectric layers and inter-metal dielectric layers. CMP processes are also commonly used in the formation of the copper lines that interconnect the components of integrated circuits.

After a CMP process, the surface of the wafer, on which the CMP process has been performed, is cleaned to remove residues. The residues may include organic matter and particles, among other things. In recent generations of integrated circuits, the sizes of the integrated circuit devices are reduced to a very small scale. The small scale of recent generations of integrated circuits poses a demanding requirement on the post-CMP cleaning over the post-CMP cleaning requirements for older generations of integrated circuits. For example, the size of the particles that remain after the post-CMP cleaning cannot exceed a half of the critical dimension (the gate length) of the transistors on the wafer. Obviously, with the size reduction of the integrated circuit devices, the removal of particles and residue from the wafer become more demanding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3D is a flow chart of residue being removed from a wafer surface, in accordance with some embodiments.

DETAILED DESCRIPTION

Figure 1:
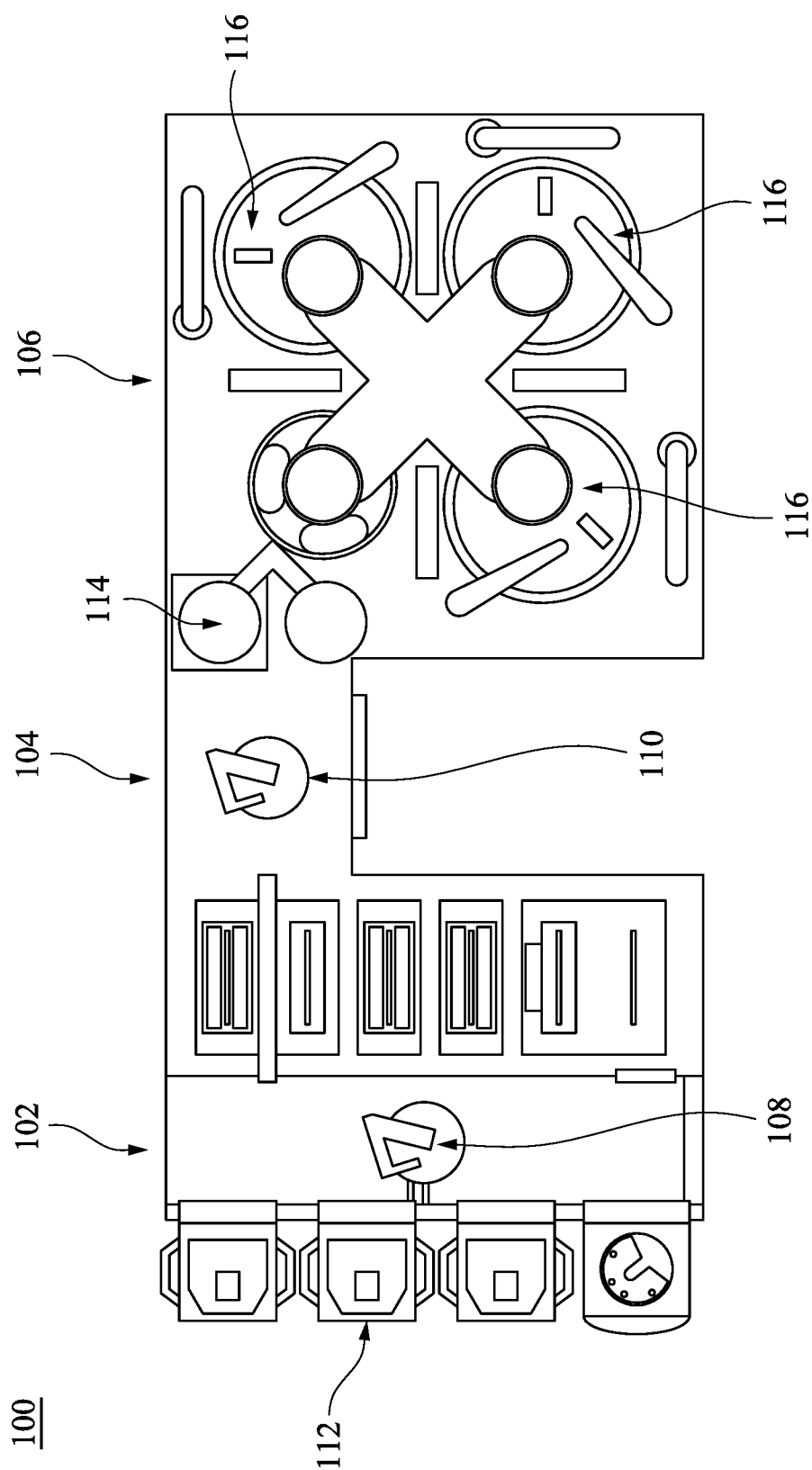
FIG. 1 is a top view of a CMP system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An apparatus and methods for performing steps in a Chemical Mechanical Polish (CMP) and post-CMP cleaning are provided in accordance with various exemplary embodiments. Some variations of some embodiments are discussed. Throughout the various views and illustrative embodiments, like reference numbers are used to designate like elements.

Referring to FIG. 1, a CMP system 100 where one or more semiconductor substrates or wafers 124 (illustrated in FIG. 2) may undergo a CMP process, including a post-CMP cleaning, is presented. In some embodiments, the CMP system 100 includes an interface 102, a cleaning module 104 and a polishing or planarization module 106. In an embodiment, the CMP system 100 includes a dry robot 108 to transfer the substrates or wafers 124 between the interface 102 and the cleaning module 104. In yet some embodiments, the CMP system 100 further includes a wet robot 110 to transfer the substrates or wafers 124 between the cleaning module 104 and the planarization module 106.

The interface 102 generally includes one or more cassettes 112 for storing the substrates or wafers 124. In some embodiments, the dry robot 108 is configured to transfer the substrates or wafers 124 between the one or more cassettes 112 and the cleaning module 104. FIG. 1 illustrates four storage cassettes 112, however, in some embodiments there may be less than four cassettes 112 or there may be more than four cassettes 112.

In an embodiment, the dry robot 110 has sufficient range of motion to facilitate transfer between the storage cassettes 112 and the cleaning module 104. Optionally, the range of motion of the dry robot 108 may be increased by adding additional linkages to the robot or placing the robot on a rail mechanism. The dry robot 108 is also configured to receive the substrates or wafers 124 from the cleaning module 104 and return cleaned, polished substrates or wafers 124 to the cassettes 112. The wet robot 110, in some embodiments, has sufficient range of motion to transfer the substrates or wafers 124 between the cleaning module 104 and one or more load cups 114 disposed on the planarization module 106. The range of motion of the wet robot 110 may optionally be increased by adding additional linkages to the robot or placing the robot on a rail mechanism. In other embodiments (not shown), the wet robot 110 may be configured to transfer the substrates or wafers 124 between the interface 102, the cleaning module 104 and/or the planarization module 106.

The cleaning module 104, in some embodiments, is used in a post-CMP process to clean the wafer 124. The CMP process may leave debris, including organic and inorganic residues, as well as watermarks on the wafer 124. The cleaning module 104 may be used to remove at least some of the debris and/or the watermarks from the wafer 124 that collects on the wafer 124 during the CMP process. In some embodiments, the cleaning module 104 may use brushes (not shown) to remove the residue from the wafer 124. In yet some embodiments, the cleaning module 104 may use a sonic cleaner (not shown), such as a megasonic cleaner, to remove the residue from the wafer 124. In other embodiments, the cleaning module 104 may use both brushes and a sonic cleaner to remove the residue from the wafer 124. The post-CMP cleaning step may include a plurality of steps including and not limited to, cleaning using an acidic chemical solution, cleaning using an alkaline chemical solution, cleaning using a neutral chemical solution, and rinsing with deionized water (DIW). The post-CMP cleaning may also include a plurality of cycles, each including a chemical solution cleaning step and a rinsing step.

Figure 2:
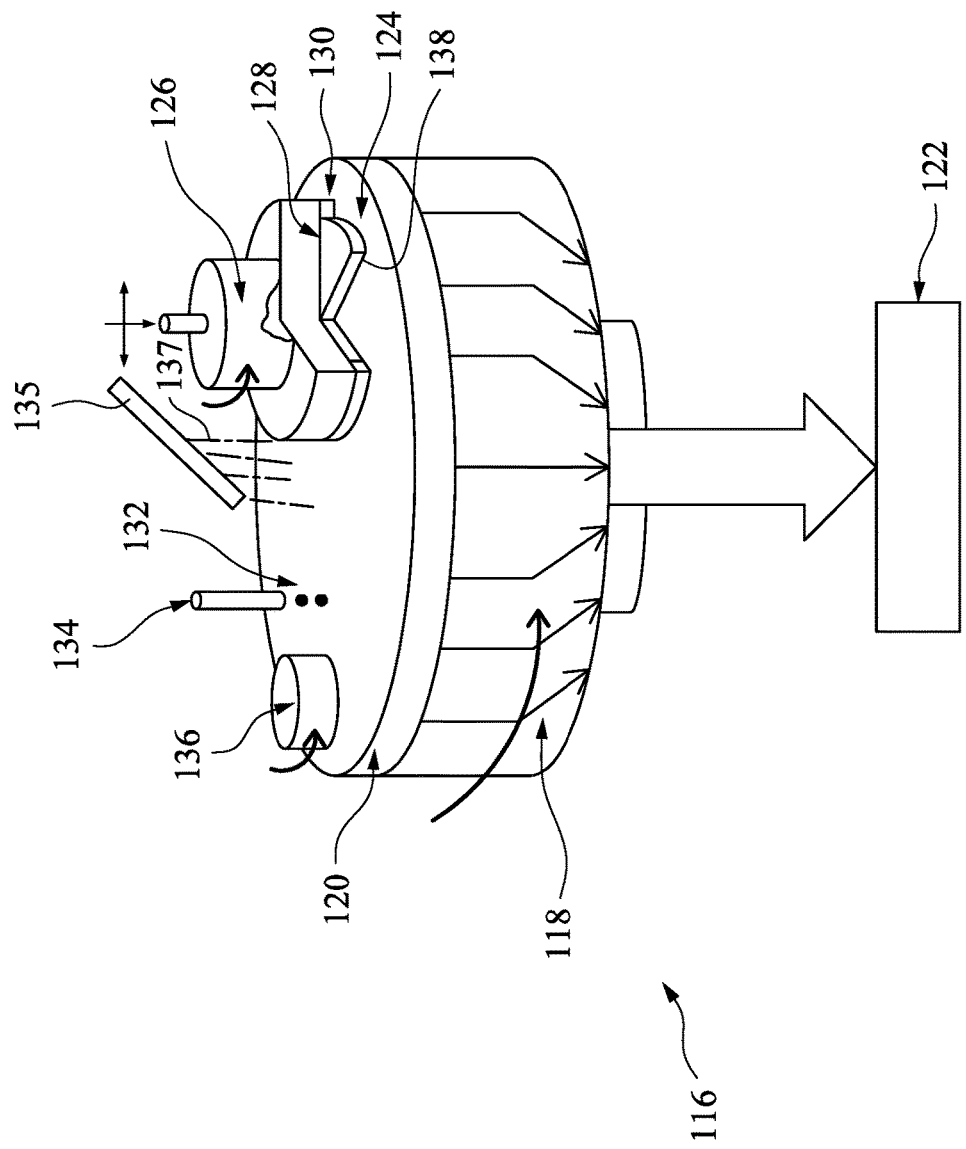
FIG. 2 is a detailed isometric view of one of the planarization stations presented in FIG. 1, in accordance with some embodiments.

Referring now to FIGS. 1 and 2, but with particular reference to FIG. 2, the planarization module 106 includes a plurality of planarization stations 116. Each of the plurality of planarization stations 116 has a rotating table or platen 118. The platen 118 is covered by a polishing pad 120. In some embodiments, the polishing pad 120 is adhered to the platen 118 through a vacuum system 122 that is external or internal to the CMP system 100. The platen 118 may be provided with a series of distributed holes (not shown) operatively connected to the vacuum system 122, allowing the polishing pad 120 to be subjected to an appropriate vacuum. The polishing pads 120, in some embodiments, may be comprised of cast or sliced polyurethane, polyurethane impregnated polyester felt, or another suitable material.

The wafer 124 is connected to a polishing spindle 126 such that a surface 138 of the wafer 124 to be polished faces the polishing pad 120 and the platen 118. In some embodiments, the polishing spindle 126 may also be referred to as a head or a carrier. The polishing spindle 126 is adaptable to accept the wafer 124 from and return the wafer 124 to the load cup 114. The wafer 124 may be held by vacuum to the polishing spindle 126 or held thereto by a backing film 128. In some embodiments, the wafer 124 is encompassed by a retainer ring 130.

The wafer 124 may be hydrophobic and, in some embodiments, has a surface 138 formed of poly-silicon, silicon nitride, silicon oxide or other component that intrinsically has a hydrophobic surface property. In another embodiment, the wafer 124 is not inherently hydrophobic, but may undergo treatments during the CMP process that cause at least the surface 138 of the wafer 124 to have hydrophobic properties. For example, and as will be discussed in more detail below, the wafer 124 may be treated with slurries or solutions that cause the wafer 124 or the surface 138 of the wafer 124 to have hydrophobic properties or otherwise increase the hydrophobicity of the wafer 124 or the surface 138.

A planarization slurry 132 may be introduced onto the polishing pad 120 via a slurry dispenser 134. It should be appreciated that the planarization slurry 132 may have different properties depending on the type of surface treatment being applied to the wafer 124, the type of CMP process being performed or the stage of the CMP process. It will be appreciated by one of skill in the art that a number of different types of surface treatments may be performed on the wafer 124 during various stages of the CMP process.

In some embodiments, the initial CMP process steps may be focused on surface treatments that include planarization of the wafer 124 and, therefore, may use slurries, such as the planarization slurry 132, that include chemical or mechanical etchants and/or have strong hydrophobic properties. Slurries with strong hydrophobic properties may dry quicker than other types of slurries. In some aspects, the application of slurries with hydrophobic properties may cause a thin hydrophobic film (not shown) to be formed on the surface 138 of the wafer 124. As will be described in more detail below, allowing a hydrophobic film to form on the surface 138 of the wafer 124 or otherwise leaving an already formed hydrophobic film on the surface 138 of the wafer 124 may cause problems in removing debris and watermarks in the post-CMP cleaning of the wafer 124.

Each of the plurality of planarization stations 116 may further include a high pressure rinse dispenser 135 for applying a high pressure rinse onto the polishing pad 120 to rinse-off the wafer 124. In some embodiments, the high pressure rinse dispenser 135 applies the high pressure rinse at a flow rate of approximately 1 to 50 L/min. The high pressure rinse dispenser 135 may, for example, dispenses a hydrophilic slurry or hydrophilic solution 137 onto the polishing pad 120. The high pressure rinse may be applied in later CMP process step(s) that are focused on surface treatments that include preparing the wafer 124 for post-CMP cleaning.

The hydrophilic solution 137 has strong hydrophilic properties. In some embodiments, the hydrophilic solution 137 may be a hydrophilic solution or include a hydrophilic solution that is operable to change the surface 138 of the wafer 124 from hydrophobic to hydrophilic on a molecular level. In some embodiments, the hydrophilic solution 137 may include the properties of being acidic, having a low molecular-weight poly-glycol polymer functional group, and include a wetting agent with an OH— group, which together help make the hydrophilic solution 137 operable to change the surface 138 of the wafer 124 from hydrophobic to hydrophilic on a molecular level. In yet some embodiments, the acidic range of the hydrophilic solution 137 is between a pH of about 3-5. The hydrophilic solution 137, generally, will not contain sulfur or metal ions. One such hydrophilic solution is Planerlite 6000™ sold by Fujimi Corporation. Embodiments in which the hydrophilic solution 137 is operable to change the surface 138 of the wafer 124 from hydrophobic to hydrophilic will be discussed in more detail below.

A pad conditioner 136 may also be employed to prepare and condition the surface of the polishing pad 120 during, before and/or after CMP processes. The pad conditioner 136 may condition the polishing pad 120 to provide a flat surface, remove glazing from the polishing pad 120, restore asperities, and/or other suitable conditioning. In some embodiments, the pad conditioner 136 may be a diamond CMP conditioner.

During the CMP process, including the pre-cleaning stage of the CMP process, the polishing spindle 126 is rotated. The polishing spindle 126 places the wafer 124 against the polishing pad 120 as both the polishing spindle 126 and the polishing pad 120 rotates. In some embodiments, the polishing spindle 126 may press the wafer 124 against the polishing pad 120 to apply a mechanical pressure between the wafer 124 and the polishing pad 120. In alternative embodiments, no pressure or de minimis pressure is applied between the wafer 124 and the polishing pad 120. Generally, pressure is applied between the wafer 124 and the polishing pad 120 during planarization and no pressure or de minimis pressure (relative the mechanical pressure that may be applied during planarization steps) is applied during the pre-cleaning stage. The planarization slurry 132 or the hydrophilic solution 137 is then introduced onto the polishing pad 120.

Whether the planarization slurry 132 or the hydrophilic solution 137 is dispensed onto the polishing pad 120 depends on the surface treatment being applied to the wafer 124 and/or the stage of the CMP process. For example, and as previously mentioned, during the planarization stages of the wafer 124, the planarization slurry 132 is applied to the polishing pad 120, where the planarization slurry 132 includes chemical and/or mechanical etchants, hydrophobic properties or both. During planarization, the CMP process steps may rely on the chemical etchants or abrasive properties of the slurry 132 as well as mechanical pressure being applied between the wafer 124 and the polishing pad 120, e.g., force applied between the wafer 124 and the polishing pad 120, to smooth out or otherwise planarize the surface 138 of the wafer 124. In the pre-cleaning stage of the CMP process, the hydrophilic solution 137 will generally be applied to the polishing pad 120.

In some embodiments, the pre-cleaning step is performed on the surface 138 of the wafer 124 prior to the wafer 124 being removed from the planarization module 106, or otherwise, prior to the wafer 124 being moved to other platens within the planarization module 106. As previously mentioned, the CMP process may leave debris, including organic and inorganic residues on the surface 138 of the wafer 124. In some aspects, the debris may be difficult to remove in subsequent steps, including post-CMP cleaning steps for a number of different reasons. In some aspects, the debris may be especially difficult to remove in further steps if the debris is allowed to dry on the wafer 124. And, in operation, it may take several minutes before the wafer 124 is presented for buffing or a post-CMP cleaning process, allowing the debris to dry on the wafer 124 before a subsequent cleaning step is performed. Additionally, the speed of transfer between one platen to another may increase the rate of drying before the wafer 24 is presented for buffing or a post-CMP cleaning process. Furthermore, the surface properties of the wafer 124 may make it difficult to remove debris that has dried on the wafer 124. In some embodiments, the hydrophobicity of the surface 138 of the wafer 124 can cause the debris to bond, stick or otherwise adhere to the surface 138 of the wafer 124 in such a manner that it may become difficult to remove some of the debris. In some aspects, the debris may also be hydrophobic, thus, creating a tendency for a greater bond between the surface 138 (when the surface 138 is hydrophobic or allowed to form a hydrophobic film due to the composition of the planarization slurry 132 applied during the CMP process) and the debris.

To prevent or otherwise disrupt bonding between the surface 138 of the wafer 124 and the debris, a pre-cleaning step may be performed to prepare the wafer 124 for the post-CMP cleaning. The pre-cleaning step to be performed may include the step of, after the wafer 124 is polished on the platen 118, applying a high pressure rinse to the surface 138 of the wafer 124 via the high pressure rinse dispenser 135. The high pressure rinse may include the hydrophilic solution 137, which is operable to alter the surface properties on the surface 138 of the wafer 124 from hydrophobic to hydrophilic. In an embodiment, the high pressure rinse is applied to the wafer 124 before the wafer 124 is allowed to dry. In some embodiments, the hydrophilic solution 137 that was applied during the high pressure rinse may be allowed to soak on the surface 138 of the wafer 124 prior to transferring the wafer 124 for further cleaning. In an embodiment, the hydrophilic solution 137 includes the Planerlite 6000™ solution sold by Fujimi Corporation.

In one illustrative embodiment, the hydrophilic solution 137 is applied at approximately 25 degrees Celsius. In another illustrative embodiment, the hydrophilic solution 137 is applied at 25 degrees Celsius plus or minus 5 degrees Celsius. In some embodiments, the hydrophilic solution 137 includes a hydrophilic solution such as the Planerlite 6000™ solution having a concentration of approximately 0.1 to 10 percent mixed in DIW. It will be appreciated, however, that the concentration may be greater than 10 percent or less than 5 percent. In yet some embodiments, the flow rate of the high pressure rinse is approximately 500 to 50,000 milliliters per minute (mL/min). It will be appreciated, however, that this is merely an exemplary embodiment and that the flow rate may be less than 500 or greater than 50,000 milliliters per minute.

The cleaning step, which occurs after the high pressure rinse and/or soak has been applied, may be by way of a buffing step or treatment. The buffing treatment may be performed using the same production tool that is used for the CMP. Furthermore, the buffing treatment may be performed on the same polish pad 120, although different production tool and/or a different polish pad may be used. During the buffing step, the surface 138 of the wafer 124 may be buffed. In an embodiment, the wafer 124 is buffed in the planarization module 106. In yet some embodiments, the wafer 124 is moved within the planarization module 106 to another platen before the wafer 124 is buffed. In some embodiments, the buffing step may be bypassed or not performed such that the wafer 124 is taken directly from the high pressure rinse or soaking phase to a post-CMP cleaning step. In yet some embodiments, the post-CMP cleaning step occurs in the cleaning module 104

In some embodiments, after the hydrophilic solution 137 has been applied during the rinsing step, the wafer 124 is allowed to soak in the hydrophilic solution 137. In some aspects, the wafer 124 soaks in the hydrophilic solution 137 for approximately 5 to 30 seconds. In an embodiment, the wafer 124 soaks in the hydrophilic solution 137 for approximately 10 seconds. It should be appreciated, that the wafer 124 may soak in the hydrophilic solution 137 for less than 5 seconds or greater than 30 seconds. During the soaking step, the wafer 124 and the polishing pad 120 may continue to rotate with or without force being exerted between the wafer 124 by the polishing pad. After the hydrophilic solution 137 is applied to the wafer 124, the wafer 124 is removed from the platen 118 to be cleaned in a cleaning step that may, for example, utilize brush or megasonic cleaning.

In operation, the wafer 124 may undergo various polishing/planarization steps during the CMP process while the wafer 124 is in the planarization module 106. In an embodiment, after the last polishing step but prior to the post-CMP cleaning step, which may occur in the cleaning module 104, the wafer 124 is subjected to a pre-cleaning step. The pre-cleaning step includes a rinsing step, which may be a high-pressure rinse. The rinsing step includes applying the hydrophilic solution 137 to the wafer 124, wherein the hydrophilic solution 137 may act to alter the surface 138 of the wafer 124 from hydrophobic to hydrophilic. In some embodiments, the hydrophilic solution 137 is applied to the wafer 124 after the last polishing step in the CMP process but before the surface 138 of the wafer 124 is allowed to dry. The wafer 124 may be rotated via the polishing spindle 126 as the polishing pad 120 and the platen 118 are also rotated as the hydrophilic solution 137 is applied. In some embodiments, mechanical pressure is applied during this step between the wafer 124 and the polishing pad 120. In alternative embodiments, no pressure or de minimis pressure is applied between the wafer 124 and the polishing pad 120 relative the mechanical pressure that may be applied during previous CMP process steps, such as those that are related to planarization of the wafer 124.

Referring now to FIGS. 3A through 3D, a schematic representation and flow diagram, according to an illustrative embodiment, is shown. FIG. 3A illustrates a schematic representation of the wafer 124 (where at least the surface 138 of the wafer 124 is hydrophobic) interacting with a hydrophilic group 150. In some aspects, the hydrophilic group 150 may include the hydrophilic solution 137. As previously discussed, the wafer 124 may be intrinsically hydrophobic or the surface 138 of the wafer 124 may become hydrophobic due to various slurries or solutions that have been applied to the surface 138 during the CMP process. When at least the surface 138 of the wafer 124 is hydrophobic, the wafer 124 may have a hydrophobic interaction 146 with a hydrophobic group 148 found on the surface 138 of the wafer 124. The hydrophobic group 148 may include debris or residue 140 from the CMP process. In some aspects, the hydrophobic group 148 may form a hydrophobic film (not shown) over the surface 138 of the wafer 124. The debris or residue 140, which may otherwise be referred to as particles or water marks, may become attached or bonded to the hydrophobic film or the surface 138 of the wafer 124. If the residue 140 becomes too strongly attached to the surface 138 of the wafer 124, as may occur if the residue 140 dries on the wafer 124, it may be difficult to completely remove the residue 140 from the surface 138 during post-cleaning steps because the hydrophilic group 150 may be repelled or otherwise prevented from reaching the surface 138 of the wafer 124.

FIG. 3B illustrates the surface 138 of the wafer 124, wherein the surface 138 is hydrophobic. After a CMP process, the residue 140, and in some embodiments DIW 144, is located on the surface 138 of the wafer 124. Should the residue 140 and/or the DIW 144 be allowed to dry on the surface 138 of the wafer 124, a hydrophobic film (not shown) may be formed on the surface 138 with the residue 140 and the DIW bonded, attached, or otherwise connected to the hydrophobic film.

Step 152, illustrated by an arrow, represents treating the surface 138 with a surfactant, solution, or hydrophilic solution 137 that has hydrophilic properties that are operable to change the surface 138 of the wafer 124 from hydrophobic to hydrophilic. The hydrophilic solution 137 is operable to make the surface 138 of the wafer 124 hydrophilic, regardless of whether the surface 138 is hydrophobic or not. In some embodiments, a hydrophilic film 142 is formed on the surface 138 as shown in FIG. 3C.

FIG. 3C illustrates the wafer 124, with the surface 138 being hydrophobic, having the molecular level hydrophilic film 142 formed thereon. The hydrophilic film 142 creates a barrier between the surface 138 of the wafer 124 and the residue 140 and the DIW 144. In other words, the hydrophilic film 142 helps prevent the residue 140 from bonding or attaching to the surface 138 of the wafer 124. The composition of the hydrophilic film 142 may be based on the hydrophilic solution 137 with hydrophobic groups ($CH_3$ bonding) and hydrophilic groups (OH bonding).

Step 154, illustrated by an arrow, represents the wafer 124 being sent to a cleaning process, such as a post-CMP cleaning process in the cleaning module 104. In FIG. 3D, the wafer 124 is cleaned as represented by arrow 156. The wafer 124 may be cleaned by a water-flush that removes the residue 140 and the DIW 144 from the surface 138 of the wafer 124. In other embodiments, the wafer 124 may undergo brushing or sonic cleaning in the cleaning module 104. In some aspects, the wafer 124 is cleaned before the wafer 124 can dry, i.e., before the residue 140 and the DIW 144 can dry on the surface 138 of the wafer 124.

Figure 4:
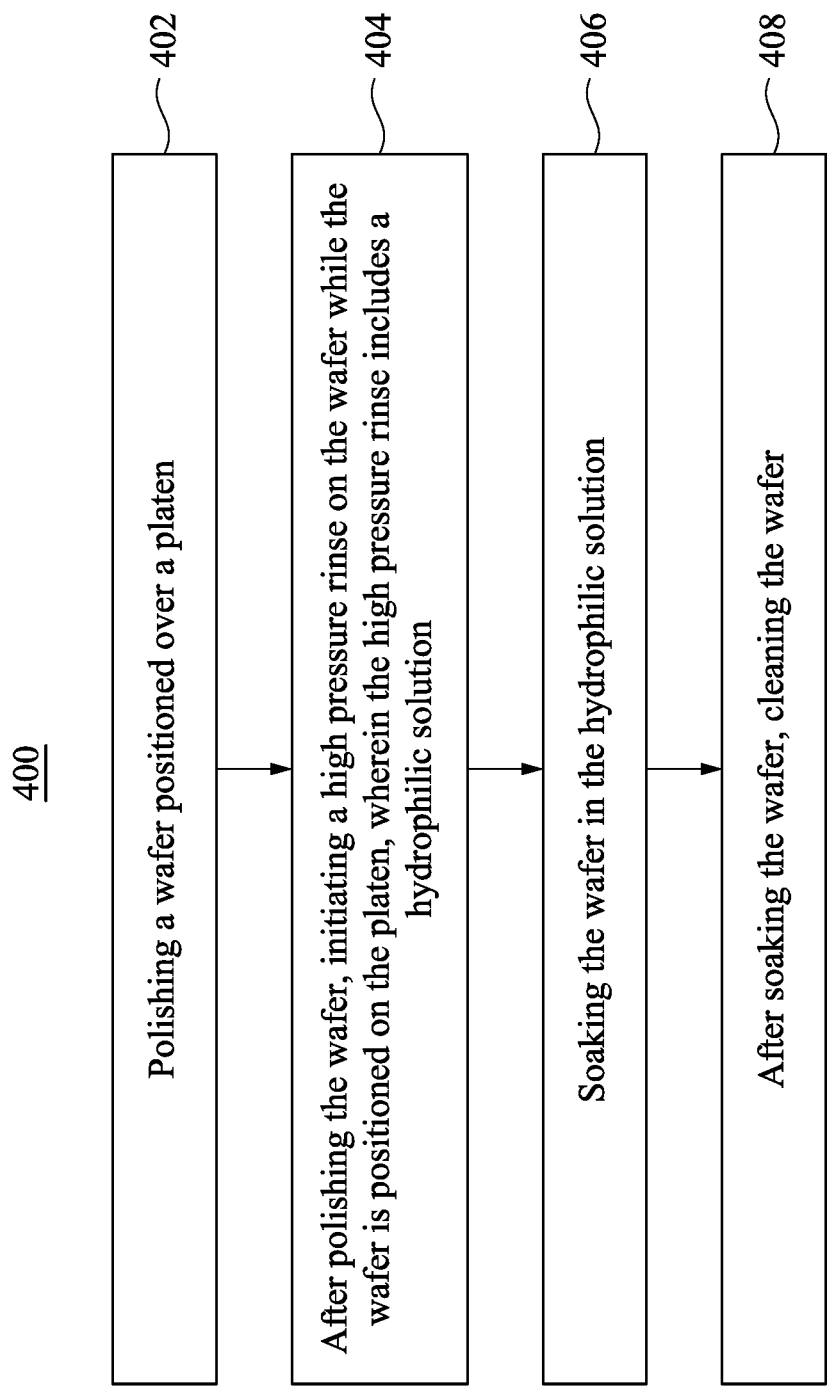
FIG. 4 is a flow chart of a method in accordance with some embodiments.

Referring to FIG. 4, a method 400 is presented in accordance with some embodiments. The method 400, in some aspects, alters the surface properties of the surface 138 of the wafer 124 to enhance the efficiency of a post-CMP cleaning step. The wafer 124 is positioned on the platen 118 and polished in a CMP process step as illustrated in step 402. The polishing step 402 may be the last polishing step in the CMP process before the wafer 124 begins the post-CMP cleaning step. Step 404 illustrates that after the polishing of the wafer 124, a high-pressure rinse is initiated on the wafer 124 while the wafer 124 is still positioned on the platen 118. In other words, the wafer 124 remains in place after the polishing step 402. Without removing the wafer 124, the high-pressure rinse is applied to the wafer 124. The high-pressure rinse of step 404 includes the hydrophilic solution 137. In alternative step 406, the wafer 124 is soaked in the hydrophilic solution 137. After soaking the wafer 124 in the hydrophilic solution 137, or at least after applying the hydrophilic solution 137 to the wafer 124, step 408 illustrates cleaning the wafer 124. The wafer 124 may be cleaned by moving the wafer 124 to the cleaning module 104.

Figure 5:
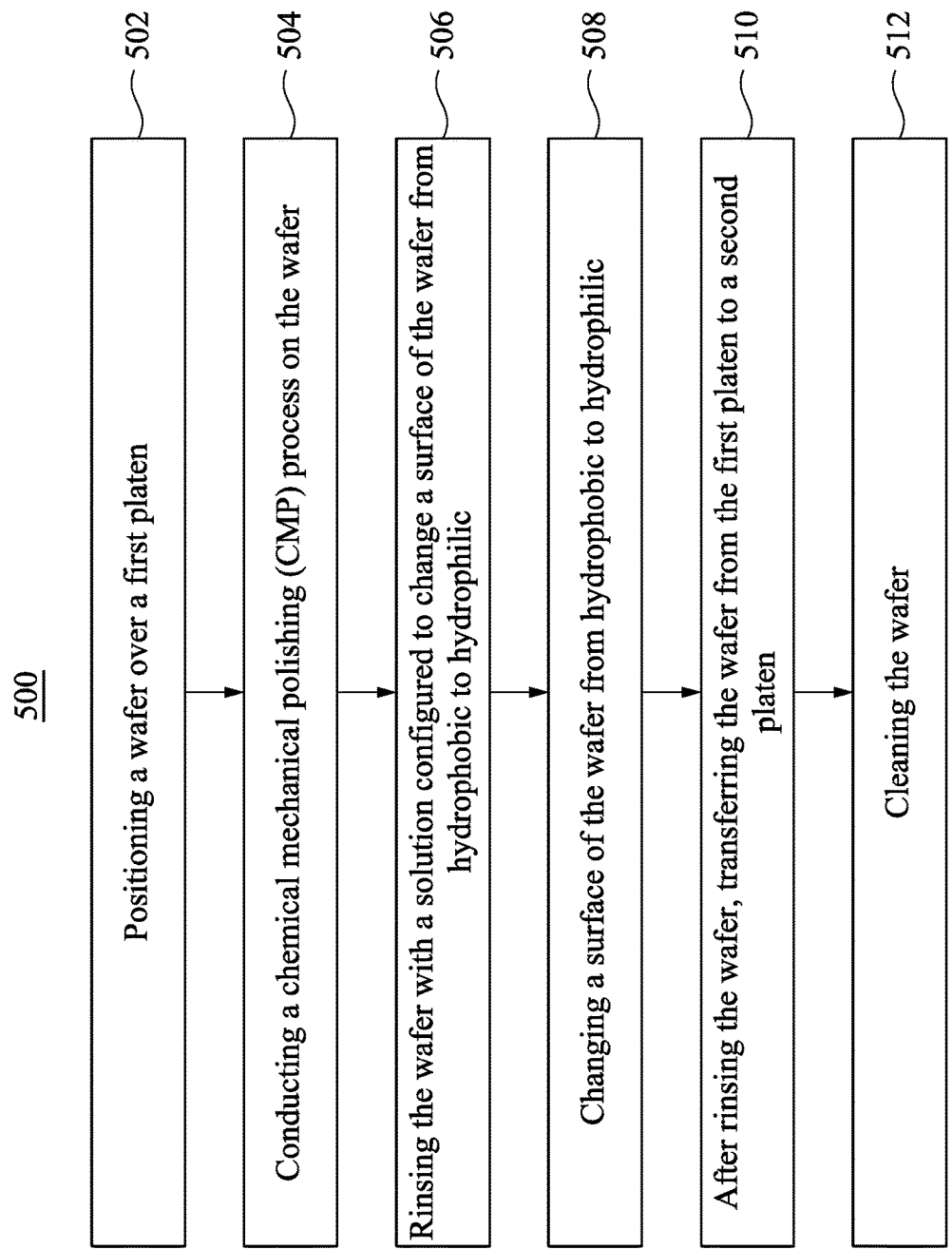
FIG. 5 is a flow chart of a method in accordance with some embodiments.

Referring to FIG. 5, a method 500 is presented in accordance with some embodiments. The method 500, in some aspects, alters surface properties of the surface 138 of the wafer 124 to enhance efficiency of a post CMP cleaning step. The wafer 124 is positioned on the platen 118 in step 502. In step 504, the CMP polishing process is conducted on the wafer 124. After the polishing step, the wafer 124 in step 506 is rinsed with the slurry or solution 132 configured to change the surface 138 of the wafer 124 from hydrophobic to hydrophilic. The surface 138 of the wafer 124 is changed from hydrophobic to hydrophilic. The surface 138 of the wafer 124 may be changed from hydrophobic to hydrophilic by soaking or otherwise applying the hydrophilic solution 137 to the wafer 124. In some embodiments, the surface 138 may include the hydrophilic film 142 (as illustrated in FIGS. 3C and 3D). In step 510, after rinsing the wafer 124, the wafer 124 is transferred from the first platen 118 to a second platen. The second platen may be a platen in the cleaning module 104 or another platen in the planarization module 106. In step 512 the wafer 124 is then cleaned. The wafer 124 may be cleaned in the cleaning module 104 or in the planarization module 106.

Figure 6:
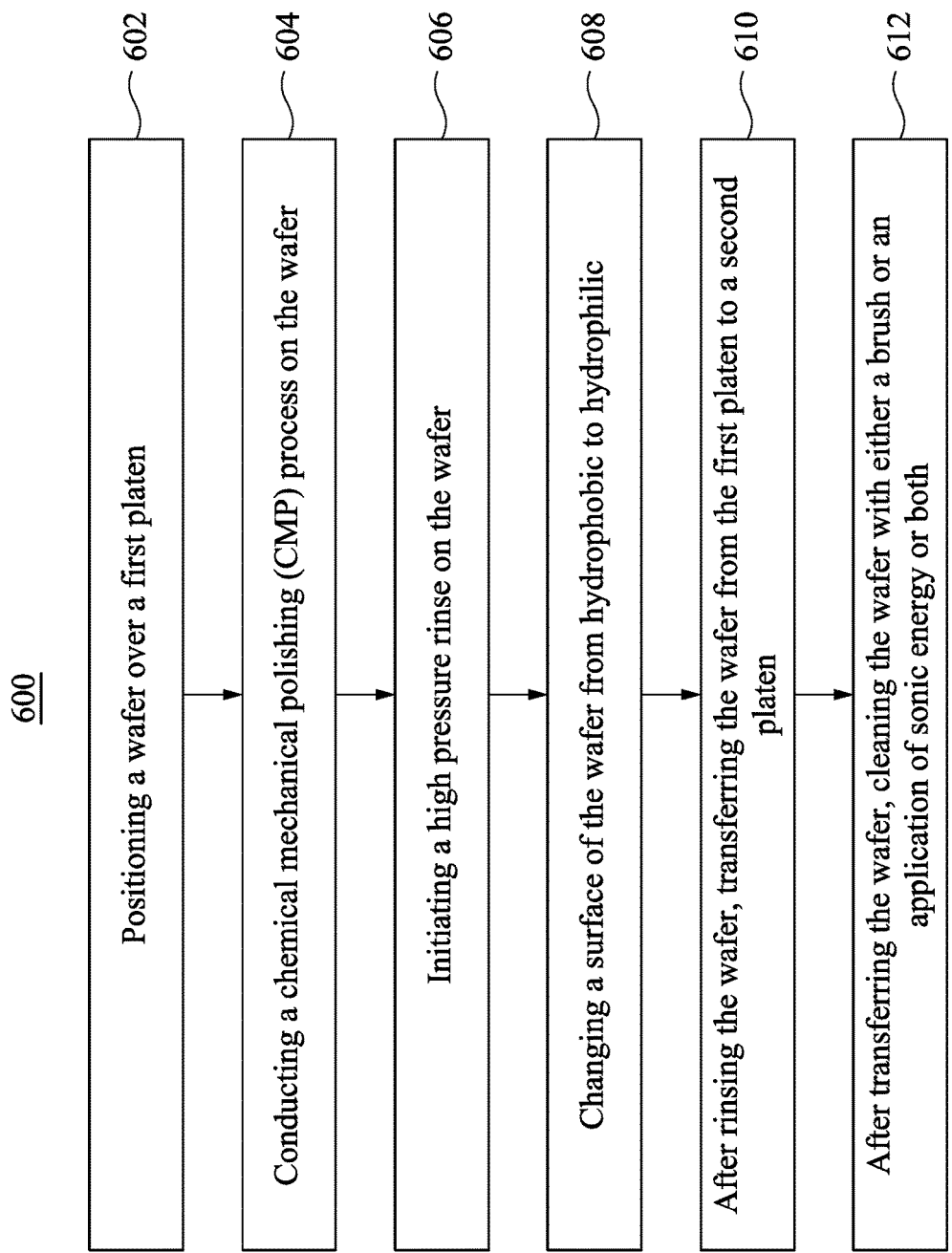
FIG. 6 is a flow chart of a method in accordance with some embodiments.

Referring to FIG. 6, a method 600 is presented in accordance with some embodiments. The method 600, in some aspects, alters the surface properties of the surface 138 of the wafer 124 to enhance efficiency of a post-CMP cleaning step. The wafer 124 is positioned over the first platen 118 in step 602. In step 604 a chemical mechanical polishing (CMP) process is conducted on the wafer 124. In step 606 a high-pressure rinse is initiated on the wafer 124. In step 608 the surface 138 of the wafer 124 is changed from hydrophobic to hydrophilic. In step 610, after rinsing the wafer 124, the wafer 124 is transferred from the first platen 118 to a second platen. The second platen may be a platen in the cleaning module 104. In step 612, after transferring the wafer 124, the wafer 124 is cleaned by either a brush, an application of sonic energy, or both.

The embodiments of the present disclosure have some advantageous features. By applying a slurry or a cleaning solution that changes the surface of the wafer from hydrophobic to hydrophilic, the cleaning step may be enhanced. The cleaning step may be enhanced in that the surface of the wafer has less residue after the surface of the wafer has been cleaned. Additionally, a buffing step may not be needed between the last polishing step in the CMP process and the cleaning step. This is advantageous in that an entire step may be skipped, providing savings in both cost and time. Moreover, the buffing step typically occurs on a separate platen than the polishing step, thus, requiring the wafer to be moved from one platen to another.

In an embodiment, a method is presented that includes the step of polishing a wafer positioned on a platen. After polishing the wafer, the method includes initiating a high pressure rinse on the wafer while the wafer is positioned on the platen, wherein the high pressure rinse includes a hydrophilic solution. The wafer is soaked in the hydrophilic solution, and after soaking the wafer, the wafer is cleaned.

In an embodiment, a method is presented that includes the steps of positioning a wafer on a first platen, conducting a chemical mechanical polishing (CMP) on the wafer and rinsing the wafer with a solution configured to change a surface of the wafer from hydrophobic to hydrophilic. The method further includes the steps of after rinsing the wafer, transferring the wafer from the first platen to a second platen and cleaning the wafer.

In an embodiment, a method is presented that includes the steps of positioning a wafer over a first platen, conducting a chemical mechanical polishing (CMP) process on the wafer, initiating a high pressure rinse on the wafer and changing a surface of the wafer from hydrophobic to hydrophilic. The method further includes the steps of after rinsing the wafer, transferring the wafer from the first platen to a second platen and after transferring the wafer, cleaning the wafer with either a brush or an application of sonic energy or both.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 polishing a wafer positioned on a first platen;
 after polishing the wafer, initiating a pressurized rinse while the wafer is positioned on the first platen, wherein the pressurized rinse dispenses a hydrophilic solution rinsing the wafer;
 stopping the pressurized rinse and soaking the wafer in the hydrophilic solution remaining from the pressurized rinse for approximately 5 to 30 seconds;
 continuously rotating the wafer while soaking the wafer in the hydrophilic solution; and
 after soaking the wafer, cleaning the wafer.

2. The method of claim 1, wherein after cleaning the wafer a surface of the wafer lacks a hydrophobic film.

3. The method of claim 1, wherein the hydrophilic solution is configured to change a surface of the wafer from hydrophobic to hydrophilic.

4. The method of claim 1, wherein the hydrophilic solution forms a hydrophilic film on a surface of the wafer.

5. The method of claim 1, wherein initiating the pressurized rinse is started prior to the polished wafer drying.

6. The method of claim 1, wherein the cleaning step occurs on a second platen.

7. The method of claim 1, wherein cleaning the wafer comprises brushing the wafer.

8. The method of claim 1, wherein cleaning the wafer comprises megasonic cleaning.

9. The method of claim 1, further comprising applying mechanical pressure to a polished surface of the wafer while soaking the wafer.

10. A method comprising:
 positioning a wafer on a first platen;
 conducting a chemical mechanical polishing (CMP) on the wafer;
 rinsing the wafer with a solution, the solution configured to form a hydrophilic surface, wherein rinsing the wafer comprises pressurized dispensing of the solution by a rinse dispenser;
 after rinsing the wafer with the solution, soaking the wafer in the solution remaining from the rinsing step;
 while soaking the wafer, rotating the first platen;
 after soaking the wafer, transferring the wafer from the first platen to a second platen; and
 cleaning the wafer.

11. The method of claim 10, wherein rinsing the wafer in the solution is started prior to the polished wafer drying.

12. The method of claim 10, wherein rinsing the wafer comprises a rinse having a flow rate between 1 and 50 L/min.

13. The method of claim 10 further comprising soaking the wafer in the solution for approximately 10 seconds.

14. The method of claim 10, wherein the solution prevents a hydrophobic film from forming on the surface of the wafer.

15. The method of claim 10, wherein the cleaning step does not include a buffing step.

16. The method of claim 10, wherein cleaning the wafer comprises brushing the wafer.

17. The method of claim 10, wherein:
 the wafer initially has a hydrophobic surface before the wafer is exposed to the solution;
 the solution is acidic and comprises a poly-glycol polymer functional group and a wetting agent with an OH— group;
 the solution is operable to change the hydrophobic surface of the wafer to the hydrophilic surface; and
 the solution is free from sulfur and metal ions.

18. The method of claim 10, further comprising applying mechanical pressure to a polished surface of the wafer while rotating the first platen.

19. A method comprising:
 positioning a wafer over a first platen;
 conducting a chemical mechanical polishing (CMP) process on the wafer;
 performing a pressurized rinse of the wafer using a hydrophilic solution;
 after performing the pressurized rinse, soaking the wafer for approximately 10 seconds by keeping the wafer in the hydrophilic solution;
 while soaking the wafer, rotating the wafer;
 changing a surface of the wafer from hydrophobic to hydrophilic;

after rinsing the wafer, transferring the wafer from the first platen to a second platen; and after transferring the wafer, cleaning the wafer with a brush or megasonic cleaning.

20. The method of claim 19, further comprising, while rotating the wafer, applying mechanical pressure to a polished surface of the wafer.

* * * * *